(12) United States Patent
Duerbaum et al.

(10) Patent No.: US 6,377,021 B2
(45) Date of Patent: Apr. 23, 2002

(54) POWER SUPPLY UNIT OR BATTERY CHARGING DEVICE

(75) Inventors: Thomas Duerbaum, Langerwehe; Peter Luerkens, Aachen; Juergen Halfmann, Buehlertal, all of (DE)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/817,087

(22) Filed: Mar. 26, 2001

(30) Foreign Application Priority Data

Mar. 30, 2000 (DE) .......................... 100 15 885

(51) Int. Cl.⁷ ............................. H01M 10/46
(52) U.S. Cl. ...................... 320/107; 361/709
(58) Field of Search ................. 320/107, 112, 320/114, DIG. 34, DIG. 35, DIG. 36; 361/600, 676, 688, 701, 704, 709, 711

(56) References Cited

U.S. PATENT DOCUMENTS 5,016,139 A    5/1991  Stopa et al.

OTHER PUBLICATIONS

IEC; 60950; Third Edition.

*Primary Examiner*—Edward H. Tso
(74) *Attorney, Agent, or Firm*—Eric Bram

(57) ABSTRACT

The invention relates to a power supply unit or battery charging device (1). While of compact type, the device is to dissipate to the environment the heat generated during operation and, on the other hand, is to be extremely handy. There is proposed to provide cooling fins (4) on the housing (2) of the device, while the cooling fins (2) are arranged so that the cooling fin interstices are suitable for locking a cable (5) of the device.

5 Claims, 3 Drawing Sheets

POWER SUPPLY UNIT OR BATTERY CHARGING DEVICE

The invention relates to a power supply unit or battery charging device. Power supply units convert currents or voltages from energy supply networks into currents or voltages suitable for the operation of electric units or devices. Battery charging devices are used for charging accumulators, for example, for mobile telephones, cordless telephones or portable computers.

The housing of a power supply unit or battery charging device is usually made of plastic, which is cost effective and guarantees an electrical insulation. A device cable that can be plugged into the power supply unit or battery charging device is used for setting up a connection to the device or accumulator respectively to be supplied with power.

U.S. Pat. No. 5,016,139 discloses a power supply unit in which the housing comprises two parts and is at least partly made of metal or plastic. The upper part of the housing has an area in the form of a grid of fins. The fins end in the plane of the upper part of the housing and have their base in a base area of substantially the same thickness, which is shaped so that it is complementary with the shape of two capacitors in the assembled power supply unit and holds them in a bracket device. The basic area has on the side facing the capacitors a coating that has a high coefficient of thermal conductivity, so that heat produced by the capacitors during the operation of the power supply unit is very well dissipated to the environment.

It is an object of the invention to provide a power supply unit which, having a compact structure, dissipates heat well to the environment during operation and, is also extremely handy.

The object is achieved in that the power supply unit or battery charging device has a housing with cooling fins, in which the cooling fins are arranged so that the interstices between the cooling fins are suitable for locking a cable of the device.

With such an embodiment of the unit, the cooling fins are used not only for cooling the device involved but, in addition, also for accommodating a cable which can be locked between the cooling fins (clamped), so that a compact handy unit is developed. Locking the cable of the device between the cooling fins is particularly advantageous for the transport of the device, because the cable is then not transported as a loose part and cannot be lost as a separate part during transport either. Only a respective distance between the cooling fins is to be guaranteed. Further additional material is not necessary.

More particularly, the housing is arranged as an injection molding plastic part and can be manufactured cost effectively, while the curving of the cooling fins is no problem.

To further improve the heat dissipation to the environment, there is proposed that on the inside of the housing a coating is deposited which has a high coefficient of thermal conductivity. A strong heating of the housing in small areas is avoided, so that also a guarantee may be given that a housing made of plastic exceeds the permissible maximum temperature of the plastic at no spot whatsoever. The coating having a high coefficient of thermal conductivity is, for example, a metallic coating which can be deposited on the inside of the housing of the device in an easy and cost effective manner. An additional effect is that the radiation of electromagnetic waves to the environment is reduced i.e. the EMV properties of the power supply unit or battery charging device are improved.

Alternatively, or in addition to an inside coating of the housing of the unit having a high coefficient of thermal conductivity, cooling fins may be arranged on the inside of the housing to promote the dissipation of heat from the inside of the housing to the environment.

In another embodiment is provided that the housing has recesses on the inside. They additionally increase the surface and also enhance the heat dissipation to the environment. They may be adapted to the device components to be installed on the inside of the housing i.e. they should be arranged closest possible to the inside of the housing.

Examples of embodiment of the invention will be further explained with reference to the drawings to be discussed hereinafter, in which.

Figure 1:
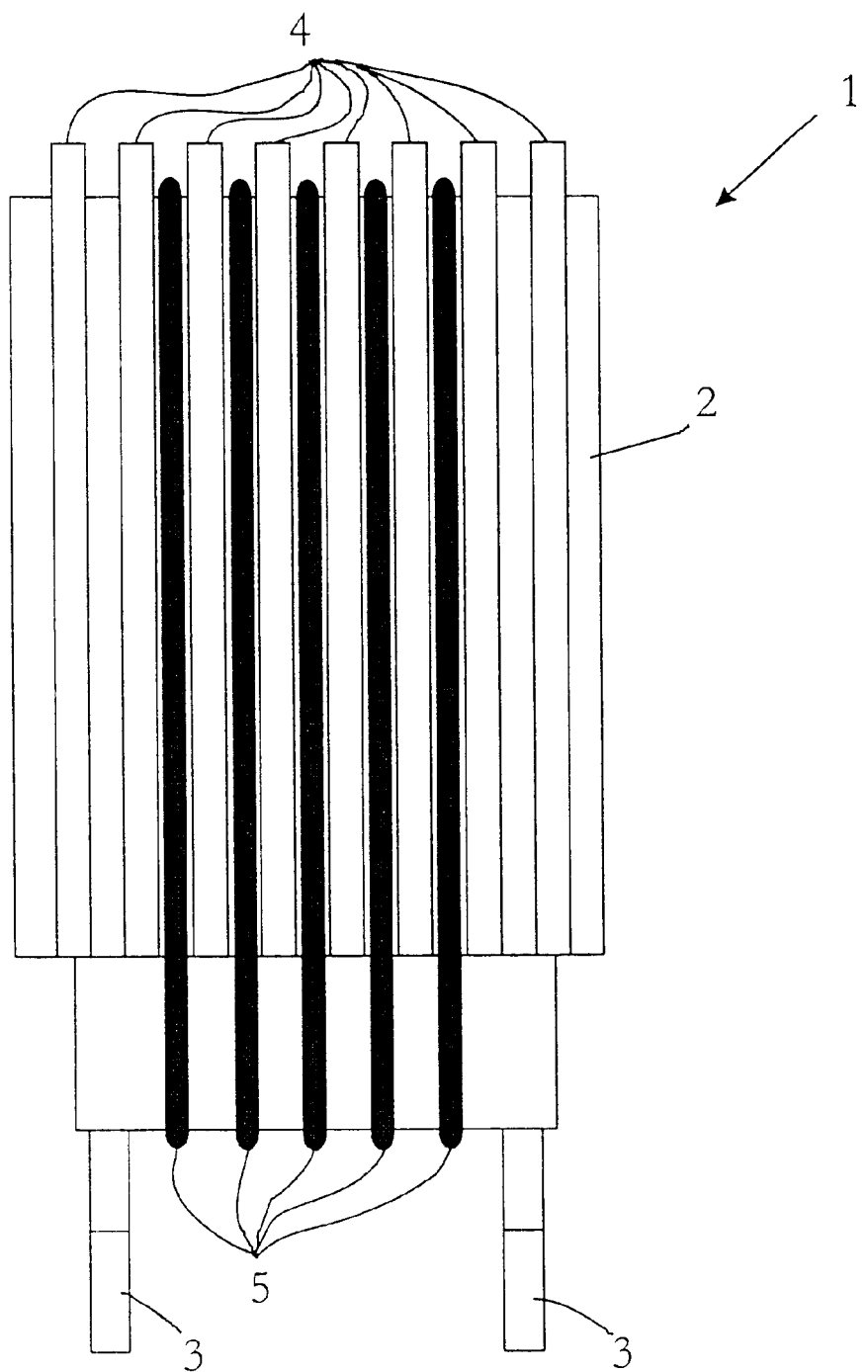
FIG. 1 shows a front view of a power supply unit or battery charging device.

FIG. 1 shows a power supply unit or battery charging device 1 having a plastic housing 2 which is shown here to be one integral part and surrounds the whole device 1 except for bare mains plug contacts 3. On the outside of the housing of the device 2 lie cooling fins 4 in parallel with each other. The housing 2 including the cooling fins 4 is manufactured as a single part with the plastic injection molding method. Between the cooling fins 4 is clamped a cable 5 of the device. The cable is wound around the housing 2. The cooling fins 4 have such a distance to each other that the cable 5 can be detachably fixed between the cooling fins 4. The distance between the cooling fins 4 is so much smaller than the diameter of the cable 5 that this cable can be inserted into the cooling fin interstices without any problem and, in addition, still a sufficient clamping force is exerted by the cooling fin side walls onto the inserted (wound) cable 5 of the device.

Figure 2:
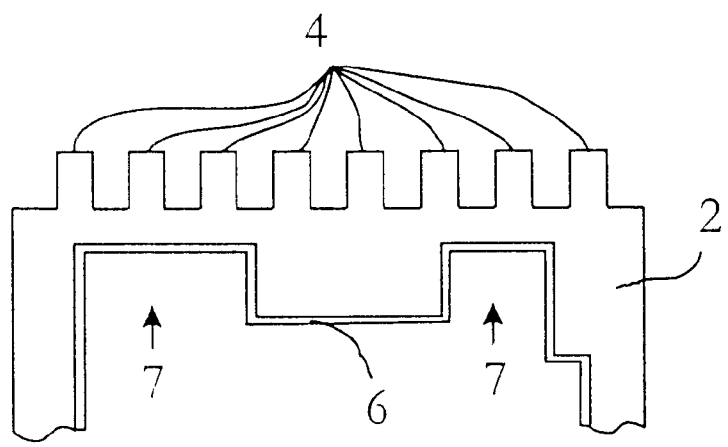
FIG. 2 shows a section through part of the housing of the device.

FIG. 2 shows a section through the upper region of the housing 2 of FIG. 1. The inside of the housing has a coating 6—metallic here—that has a high coefficient of thermal conductivity and is used for improving the heat dissipation. For example, recesses 7 are shown, which are adapted to the internal components of the device (not shown). The recesses 7 increase the internal surface of the housing, which enhances the thermal conductivity and are further used for clamping the components lying inside the device.

Figure 3:
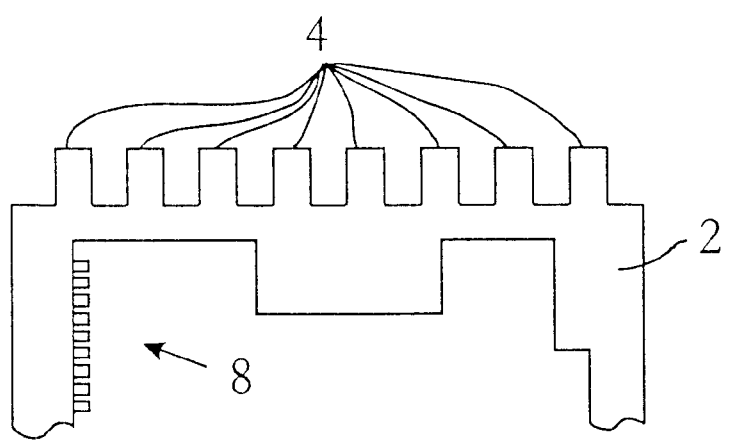
FIG. 3 shows a section through part of another embodiment of a housing of a device and FIGS. 4 to 6 show further embodiments of a housings of a device.

FIG. 3 shows additional cooling fins 8 on the inside of the housing 2 arranged in a sectional drawing of the housing shown in FIG. 2, which cooling fins are used for improving the dissipation of heat from the inside of the device to the environment of the device. Cooling fins 8 provided on the inside and the coating 6 may be used separately and in combination.

Figure 4:
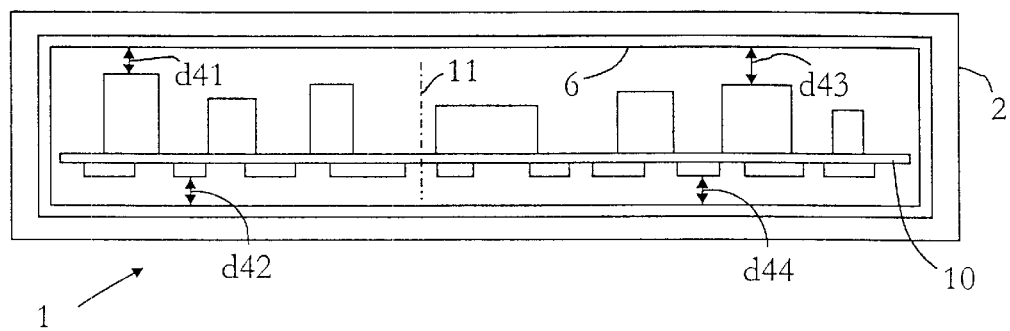
Figure 5:
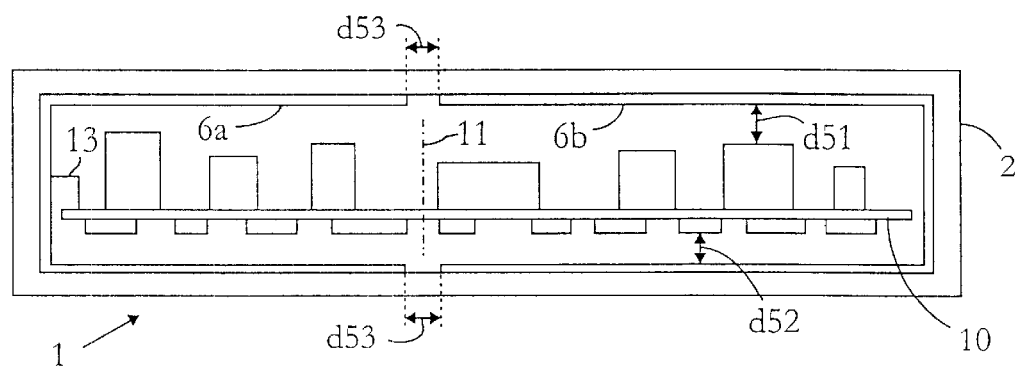
Figure 6:
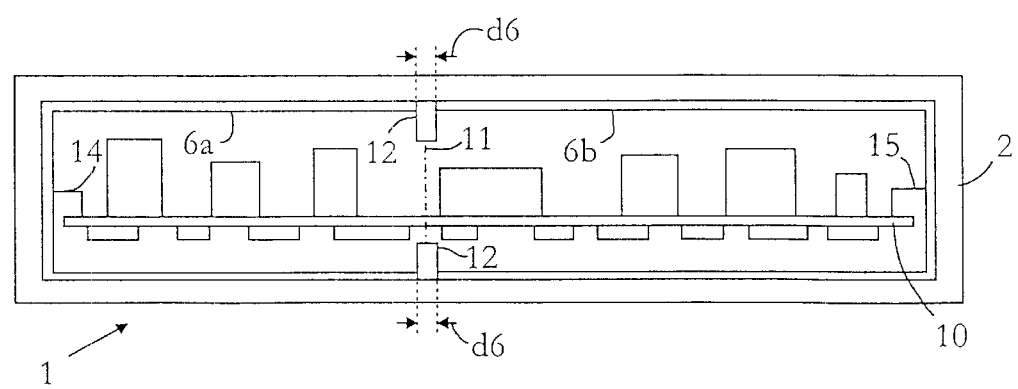

FIGS. 4 to 6 show sectional drawings of the device 1, with various possibilities of embodiment for the conducting coating 6 of the housing. Inside the housing 2 is arranged a printed circuit board 10, which carries electric modules. A number of these modules is shown, but only diagrammatically (in the form of rectangular blocks), to clarify that they are to have a certain minimum distance to the coating 6. A dashed line 11 is used for clarifying that the electric modules and switching circuits of the primary side and the secondary side are arranged spatially remote from each other. To the left of the line 11 lie the modules of the primary side, to the right of the line 11 lie the modules of the secondary side.

Basically, the modules of the primary side have to adhere to a predefined distance to the modules of the secondary side. Furthermore, minimum distances are to be observed between the modules of the printed circuit board and the coating 6, i.e. there are certain minimum creepage distances to be observed, which are normally predefined by standards, for example, by the IEC 60950 (compare chapters 2.10.4 to 2.10.6 in the 1999-04 edition).

In FIG. 4 the coating 6 is continuously deposited on the inside of the housing and has a floating connection to the printed circuit board 10. Both the modules of the primary side and the modules of the secondary side have to adhere to certain minimum distances to the coating 6. For example, distances d41, d42, d43 and d44 are shown, which must not be below certain minimum values.

FIG. 5 shows the case where the coating 6 consists of two sub-surfaces 6*a* and 6*b*, which have a distance d53 and have a primary side and secondary side, respectively. The sub-surface 6*a* is connected to the ground potential of the primary side (connection 13). This leads to the fact that only for the modules of the secondary side (see, for example, distances d51 and d52) a minimum creepage distance to the coating 6 (i.e. to the sub-surface 6*b*) is to be adhered to. Furthermore, a minimum creepage distance is to be maintained between the sub-surfaces 6*a* and 6*b*, i.e. the distance d53 shown must exceed a certain minimum value.

In the variant of embodiment shown in FIG. 6, the coating 6, just like in FIG. 5, consists of two sub-surfaces 6*a* and 6*b* between which, however, a non-electrically conducting fin 12 is arranged, which leads to the fact that the distance between the sub-surfaces 6*a* and 6*b*, which is referred to as d6, may be smaller than the distance without a fin (like in FIG. 5). In FIG. 6 the sub-surface 6*a* is connected to the ground potential of the primary side (connection 14) and sub-surface 6*b* to the ground potential of the secondary side (connection 15), so that only for the distance d6 there is a minimum creepage distance.

The possibilities of embodiment shown in FIGS. 4 to 6 are to indicate the multitude of possible embodiments of the inside coating 6. Further combinations and variants are possible, obviously. For example, in FIG. 4, the coating 6 may also be connected to the ground potential of the primary or the secondary side. In FIG. 5 could be effected, instead of or in addition to the connection of the sub-surface 6*a* to the ground potential of the primary side, a connection of the sub-surface 6*b* to the ground potential of the secondary side. The variants thus produced in connection with FIG. 5 may naturally also be transferred to the embodiment shown in FIG. 6.

What is claimed is:

1. A power supply unit or battery charging device having a housing (2) with cooling fins (4), the cooling fins (2) being arranged so that the interstices between the cooling fins are suitable for locking a cable (5) of the device.

2. A power supply unit or battery charging device as claimed in claim 1, characterized in that the housing (2) is arranged as a plastic injection-molded part.

3. A power supply unit or battery charging device as claimed in claim 1 or 2, characterized in that a coating (6) having a high coefficient of thermal conductivity is deposited on the inside of the housing (2).

4. A power supply unit or battery charging device as claimed in one of the claims 1 to 3, characterized in that cooling fins (8) are provided on the inside of the housing (2).

5. A mains or charging device as claimed in one of the claims 1 to 4, characterized in that the housing (2) has recesses (7) on the inside.

\* \* \* \* \*